(12) United States Patent
Fujii

(10) Patent No.: US 8,455,953 B2
(45) Date of Patent: Jun. 4, 2013

(54) SEMICONDUCTOR DEVICE AND METHOD OF MANUFACTURING SEMICONDUCTOR DEVICE

(75) Inventor: Hiroki Fujii, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 296 days.

(21) Appl. No.: 13/017,687

(22) Filed: Jan. 31, 2011

(65) Prior Publication Data

US 2011/0186907 A1   Aug. 4, 2011

(30) Foreign Application Priority Data

Feb. 1, 2010 (JP) ................... 2010-020661

(51) Int. Cl.
*H01L 29/66* (2006.01)
*H01L 21/8249* (2006.01)
*H01L 29/739* (2006.01)

(52) U.S. Cl.
CPC ....... *H01L 29/66325* (2013.01); *H01L 29/7393* (2013.01); *H01L 2924/13055* (2013.01)
USPC ................ 257/378; 257/577; 257/E29.066; 257/E29.197; 257/E21.382

(58) Field of Classification Search
CPC ............ H01L 29/66325; H01L 29/7393; H01L 2924/13055
USPC ................ 257/378, 577, E29.066, E29.197, 257/E21.382; 438/236
See application file for complete search history.

(56) References Cited

U.S. PATENT DOCUMENTS

| | | | | |
|---|---|---|---|---|
| 5,528,058 A | * | 6/1996 | Pike et al. | 257/142 |
| 5,548,133 A | * | 8/1996 | Kinzer | 257/155 |
| 6,448,587 B1 | * | 9/2002 | Kohno et al. | 257/133 |
| 7,304,356 B2 | * | 12/2007 | Takahashi | 257/401 |

FOREIGN PATENT DOCUMENTS

JP          05-283622 A     10/1993

* cited by examiner

*Primary Examiner* — Evan Pert
(74) *Attorney, Agent, or Firm* — Sughrue Mion, PLLC

(57) ABSTRACT

A sinker layer is in contact with a first conductivity-type well and a second conductivity-type drift layer, respectively, and is separated from a first conductivity-type collector layer. A second conductivity-type diffusion layer (second second-conductivity-type high-concentration diffusion layer) is formed in the surface layer of the sinker layer. The second conductivity-type diffusion layer has a higher impurity concentration than that of the sinker layer. The second conductivity-type diffusion layer and the first conductivity-type collector layer are isolated from each other with an element isolation insulating film interposed therebetween.

11 Claims, 12 Drawing Sheets

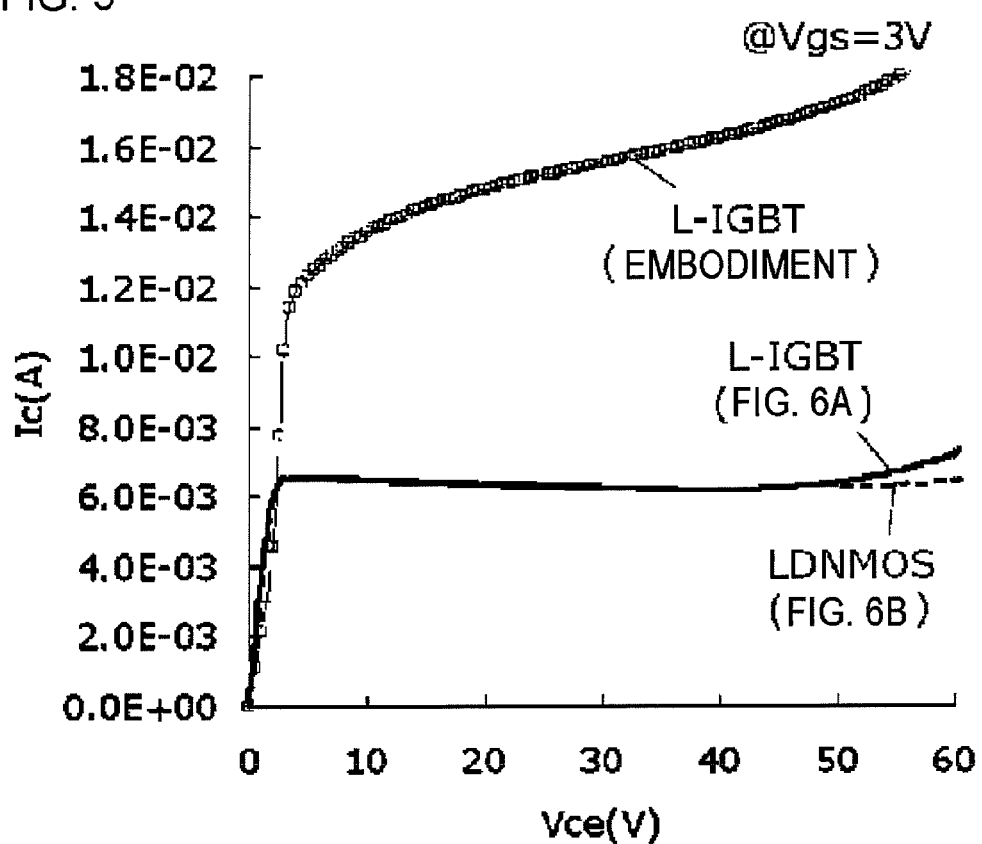

SEMICONDUCTOR DEVICE AND METHOD OF MANUFACTURING SEMICONDUCTOR DEVICE

The application is based on Japanese patent application No. 2010-020661, the content of which is incorporated hereinto by reference.

BACKGROUND

1. Technical Field

The present invention relates to a semiconductor device having an insulated gate bipolar transistor (IGBT) and a method of manufacturing the semiconductor device.

2. Related Art

An example of a structure of a semiconductor device having an IGBT includes, for example, a structure disclosed in Japanese Unexamined Patent Publication No. H05-283622. This structure is a structure in which a drain diffusion layer of a lateral double-diffused NMOS transistor (LDNMOS) is converted to a reverse conductivity type. That is, as shown in FIG. 11, an $n^+$ diffusion layer 410 serving as an emitter and a $p^+$ diffusion layer 412 serving as a back gate are disposed in parallel to each other in a $p^-$ substrate 400, and they are connected to a common emitter electrode. In addition, an $n^-$ drift layer 430 and a $p^+$ diffusion layer 432 serving as a collector are provided in the $p^-$ substrate 400. A collector electrode 434 is connected to the $p^+$ diffusion layer 432.

However, the IGBT shown in FIG. 11 has a problem that the turnoff time is long. This is for the following reason. That is, the $n^-$ drift layer 430 shown in FIG. 11 has a low impurity concentration, and is in a floating state. For this reason, when a large amount of minority carriers (particularly, holes) are implanted into the $n^-$ drift layer 430 from the $p^+$ diffusion layer 432 at the time of turnoff, the extinction of these carriers depends on the recombination with electrons existing in the $n^-$ drift layer 430.

On the other hand, Japanese Unexamined Patent Publication No. H05-283622 also discloses a semiconductor device having a structure shown in FIG. 12. This semiconductor device is configured such that in the semiconductor device shown in FIG. 11, an $n^+$ diffusion layer 433 is provided at a position short-circuited to the $p^+$ diffusion layer 432, and the $n^+$ diffusion layer 433 and the $p^+$ diffusion layer 432 are short-circuited to each other by the collector electrode 434. According to this structure, a large amount of minority carriers generated at the time of turnoff can be extracted from the collector electrode 434 through the $n^+$ diffusion layer 433. Therefore, the turnoff time can be shortened.

The following analysis is performed by the present inventor. In the semiconductor device shown in FIG. 12, since the $n^+$ diffusion layer 433 is disposed at a position adjacent to the $p^+$ diffusion layer 432, it is difficult to operate a PNP bipolar transistor included in the IGBT. In detail, in order to operate this bipolar transistor, the product of the resistance $R_1$ of the $n^-$ drift layer 430 located under the $p^+$ diffusion layer 432 and the electronic current $I_1$ flowing through the $n^-$ drift layer 430 is required to be set to be equal to or more than the built-in potential (for example, about 0.7 V) of a pn diode including the $p^+$ diffusion layer 432 and the $n^-$ drift layer 430. However, in the structure shown in FIG. 12, since the $n^+$ diffusion layer 433 is disposed adjacent to the $p^+$ diffusion layer 432, $R_1$ is reduced, and thus it is difficult for the product thereof to exceed the built-in potential. In this case, in the IGBT, since the bipolar transistor is not operated, and only the MOS transistor is operated, the current capability is remarkably reduced.

SUMMARY

In one embodiment, there is provided a semiconductor device including: a substrate having a first conductivity-type semiconductor layer in the surface layer; a first first-conductivity-type high-concentration diffusion layer, formed in the surface layer of the first conductivity-type semiconductor layer, which has a higher impurity concentration than that of the first conductivity-type semiconductor layer; a first second-conductivity-type high-concentration diffusion layer, formed in the surface layer of the first conductivity-type semiconductor layer, which is in contact with the first first-conductivity-type high-concentration diffusion layer; a second conductivity-type low-concentration drift layer, formed in the surface layer of the first conductivity-type semiconductor layer, which has a lower impurity concentration than that of the first second-conductivity-type high-concentration diffusion layer; a gate insulating film formed so as to cover the surface of the first conductivity-type semiconductor layer between the first second-conductivity-type high-concentration diffusion layer and the second conductivity-type low-concentration drift layer, and a portion of the second conductivity-type low-concentration drift layer; a gate electrode formed over the gate insulating film; a second first-conductivity-type high-concentration diffusion layer formed in the surface layer of the second conductivity-type low-concentration drift layer; a second conductivity-type sinker layer, of which at least a portion is formed in the surface layer of the first conductivity-type semiconductor layer, of which a portion is in contact with the second conductivity-type low-concentration drift layer, and which is separated from the second first-conductivity-type high-concentration diffusion layer; a second second-conductivity-type high-concentration diffusion layer formed in the surface layer of the second conductivity-type sinker layer; and an interconnect, formed over the first conductivity-type semiconductor layer, which connects the second first-conductivity-type high-concentration diffusion layer and the second second-conductivity-type high-concentration diffusion layer to each other.

According to the embodiment of invention, the second first-conductivity-type high-concentration diffusion layer and the second conductivity-type sinker layer are short-circuited through the interconnect. For this reason, a large amount of minority carriers generated at the time of turnoff of the bipolar transistor included in the IGBT can be extracted to the interconnect through the sinker layer. Therefore, the turnoff time can be shortened.

Additionally, in order to operate the bipolar transistor included in the IGBT, the product of the resistance $R_1$ between the second first-conductivity-type high-concentration diffusion layer and the second conductivity-type sinker layer and the electronic current I flowing between the second first-conductivity-type high-concentration diffusion layer and the second conductivity-type sinker layer is required to be set to be equal to or more than the built-in potential of the pn diode including the second first-conductivity-type high-concentration diffusion layer, the second conductivity-type low-concentration drift layer, and the second conductivity-type sinker layer. On the other hand, in the embodiment of the invention, since the second first-conductivity-type high-concentration diffusion layer and the second conductivity-type sinker layer are separated from each other, it is possible to increase the resistance $R_1$ between the second conductivity-type sinker layer and the second first-conductivity-type high-concentration diffusion layer. Therefore, the bipolar transistor included in the IGBT is easily operated. For this reason, it is possible to suppress a decrease in the current capability of the IGBT.

In another embodiment, there is provided a semiconductor device including: a substrate having a first conductivity-type semiconductor layer in the surface layer; a first first-conductivity-type high-concentration diffusion layer, formed in the surface layer of the first conductivity-type semiconductor layer, which has a higher impurity concentration than that of the first conductivity-type semiconductor layer; a first second-conductivity-type high-concentration diffusion layer, formed in the surface layer of the first conductivity-type semiconductor layer, which is in contact with the first first-conductivity-type high-concentration diffusion layer; a second conductivity-type low-concentration drift layer, formed in the surface layer of the first conductivity-type semiconductor layer, which has a lower impurity concentration than that of the first second-conductivity-type high-concentration diffusion layer; a gate oxide film formed so as to cover the surface of the first conductivity-type semiconductor layer between the first second-conductivity-type high-concentration diffusion layer and the second conductivity-type low-concentration drift layer, and a portion of the second conductivity-type low-concentration drift layer; a gate electrode formed over the gate oxide film; a second first-conductivity-type high-concentration diffusion layer formed in the surface layer of the second conductivity-type low-concentration drift layer; a second second-conductivity-type high-concentration diffusion layer, separated from the second first-conductivity-type high-concentration diffusion layer, which is formed in the surface layer of the second conductivity-type low-concentration drift layer; and an interconnect, formed over the first conductivity-type semiconductor layer, which connects the second first-conductivity-type high-concentration diffusion layer and the second second-conductivity-type high-concentration diffusion layer to each other.

In still another embodiment, there is provided a method of manufacturing a semiconductor device, including: forming a second conductivity-type low-concentration drift layer, located at a portion of the surface layer of a first conductivity-type semiconductor layer, in a substrate having the first conductivity-type semiconductor layer in the surface layer; forming a gate insulating film and a gate electrode located over the gate insulating film in a gate forming region including a portion of the second conductivity-type low-concentration drift layer, and a portion of the surface layer of the portion other than the second conductivity-type low-concentration drift layer in the first conductivity-type semiconductor layer; forming a first second-conductivity-type high-concentration diffusion layer, having a higher impurity concentration than that of the second conductivity-type low-concentration drift layer, in the surface layer of the first conductivity-type semiconductor layer opposite to the second conductivity-type low-concentration drift layer through the gate electrode when seen in a plan view; forming a first first-conductivity-type high-concentration diffusion layer, having a higher impurity concentration than that of the first conductivity-type semiconductor layer, in the surface layer of the first conductivity-type semiconductor layer so as to be in contact with the first second-conductivity-type high-concentration diffusion layer; forming a second first-conductivity-type high-concentration diffusion layer in the surface layer of the second conductivity-type low-concentration drift layer; forming a second conductivity-type sinker layer, of which a portion is in contact with the second conductivity-type low-concentration drift layer within the first conductivity-type semiconductor layer, in a position separated from the second first-conductivity-type high-concentration diffusion layer; forming a second second-conductivity-type high-concentration diffusion layer in the surface layer of the second conductivity-type sinker layer; and forming an interconnect, which connects the second second-conductivity-type high-concentration diffusion layer and the second first-conductivity-type high-concentration diffusion layer to each other, over the first conductivity-type semiconductor layer.

In still another embodiment, there is provided a method of manufacturing a semiconductor device, including: forming a second conductivity-type low-concentration drift layer, located at a portion of the surface layer of a first conductivity-type semiconductor layer, in a substrate having the first conductivity-type semiconductor layer in the surface layer; forming a gate insulating film and a gate electrode located over the gate insulating film in a gate forming region including a portion of the second conductivity-type low-concentration drift layer, and a portion of the surface layer of the portion other than the second conductivity-type low-concentration drift layer in the first conductivity-type semiconductor layer; forming a first second-conductivity-type high-concentration diffusion layer, having a higher impurity concentration than that of the second conductivity-type low-concentration drift layer, in the surface layer of the first conductivity-type semiconductor layer opposite to the second conductivity-type low-concentration drift layer through the gate electrode when seen in a plan view; forming a first first-conductivity-type high-concentration diffusion layer, having a higher impurity concentration than that of the first conductivity-type semiconductor layer, in the surface layer of the first conductivity-type semiconductor layer so as to be in contact with the first second-conductivity-type high-concentration diffusion layer; forming a second first-conductivity-type high-concentration diffusion layer in the surface layer of the second conductivity-type low-concentration drift layer; forming a second second-conductivity-type high-concentration diffusion layer in a position separated from the second first-conductivity-type high-concentration diffusion layer, in the surface layer of the second conductivity-type low-concentration drift layer; and forming an interconnect, which connects the second second-conductivity-type high-concentration diffusion layer and the second first-conductivity-type high-concentration diffusion layer each other, over the first conductivity-type semiconductor layer.

According to the embodiments of the invention, the turnoff time of the bipolar transistor included in the IGBT can be shortened, and the bipolar transistor included in the IGBT is easily operated.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5 is a graph illustrating a first effect of the embodiment;

DETAILED DESCRIPTION

Figure 1A:
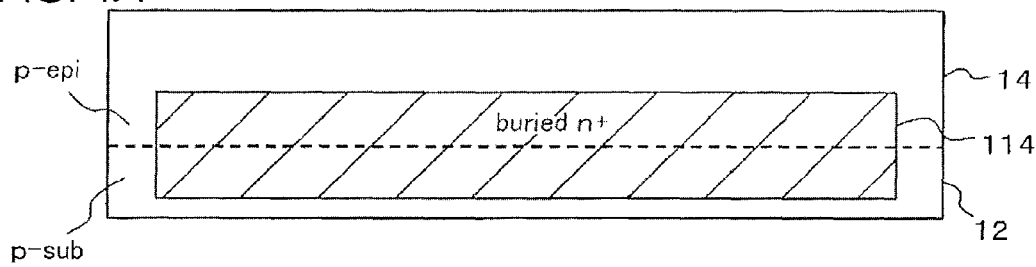
FIGS. 1A to 1D are cross-sectional views illustrating a method of manufacturing a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiments of the invention will be described with reference to the accompanying drawings. In all the drawings, like elements are referenced by like reference numerals and descriptions thereof will not be repeated.

Figure 1B:
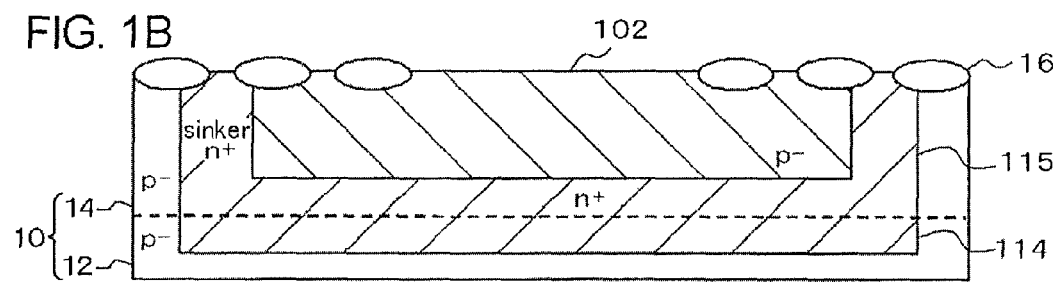
Figure 1C:
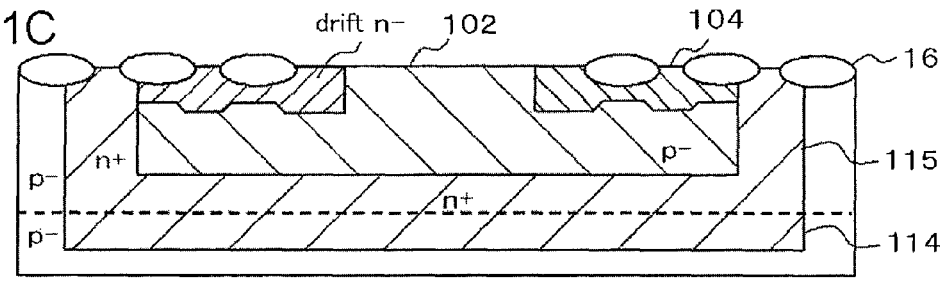
Figure 1D:
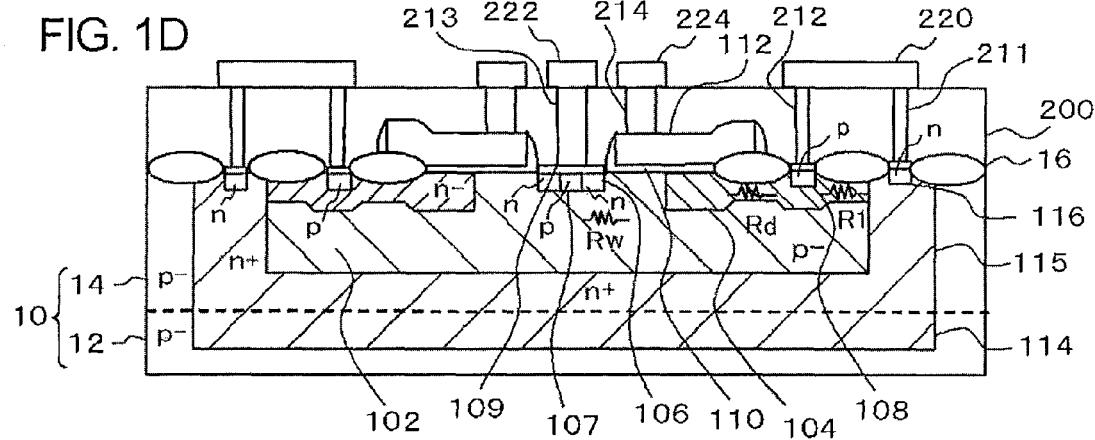

FIGS. 1A to 1D are cross-sectional views illustrating a method of manufacturing a semiconductor device according to a first embodiment. FIG. 1D in these drawings shows a cross-sectional view of the semiconductor device manufactured by this method of manufacturing the semiconductor device.

The semiconductor device shown in FIG. 1D includes a substrate 10, a first conductivity-type semiconductor layer (first conductivity-type well) 102, a second conductivity-type low-concentration drift layer (second conductivity-type drift layer) 104, a first second-conductivity-type high-concentration diffusion layer (second conductivity-type emitter layer) 106, a second first-conductivity-type high-concentration diffusion layer (first conductivity-type collector layer) 108, a first first-conductivity-type high-concentration diffusion layer (first conductivity-type well extracting diffusion layer) 107, a gate insulating film 110, a gate electrode 112, a sinker layer 115, and an interconnect 220.

The surface of the substrate 10 is formed of a first conductivity-type, for example, p-type semiconductor layer. The first conductivity-type well 102 is formed in the surface layer of the substrate 10. The second conductivity-type drift layer 104 is a second conductivity-type, for example, an n-type. The second conductivity-type drift layer 104 is formed in the surface layer of the first conductivity-type well 102, and is connected to the edge of the first conductivity-type well 102. The second conductivity-type emitter layer 106 is formed in the surface layer of the first conductivity-type well 102, is separated from the second conductivity-type drift layer 104 when seen in a plan view, and has a higher impurity concentration than that of the second conductivity-type drift layer 104. The first conductivity-type well extracting diffusion layer 107 is formed in the surface layer of the first conductivity-type well 102, has a higher impurity concentration than that of the first conductivity-type well 102, and is connected to the second conductivity-type emitter layer 106. The first conductivity-type collector layer 108 is formed in the surface layer of the second conductivity-type drift layer 104, and has a higher impurity concentration than that of the first conductivity-type well 102. The gate insulating film 110 is formed on a portion of the second conductivity-type drift layer 104, and on a region located between the second conductivity-type drift layer 104 and the second conductivity-type emitter layer 106 in the first conductivity-type well 102. The gate electrode 112 is formed on the gate insulating film 110. The sinker layer 115 is a second conductivity-type diffusion layer formed in the substrate, and the impurity concentration thereof is higher than that of the second conductivity-type drift layer 104. The sinker layer 115 is in contact with the first conductivity-type well 102 and the second conductivity-type drift layer 104, respectively, and is separated from the first conductivity-type collector layer 108. The interconnect 220 is formed on the substrate 10, and is connected to the sinker layer 115.

A second conductivity-type diffusion layer (second second-conductivity-type high-concentration diffusion layer) 116 is formed in the surface layer of the sinker layer 115. The second conductivity-type diffusion layer 116 has a higher impurity concentration than that of the sinker layer 115. An element isolation insulating film 16 is formed in the surface layer of an epitaxial layer 14. The element isolation insulating film 16 is located between the second conductivity-type diffusion layer 116 and the first conductivity-type collector layer 108. That is, the second conductivity-type diffusion layer 116 and the first conductivity-type collector layer 108 are isolated from each other by the element isolation insulating film 16.

Meanwhile, the element isolation insulating film 16 is also located between the first conductivity-type collector layer 108 and the second conductivity-type emitter layer 106. A portion of the gate electrode 112 is also located on the element isolation insulating film 16 which is located at this portion. However, the element isolation insulating film 16 and the second conductivity-type emitter layer 106 are separated from each other.

An insulating interlayer 200 is formed on the substrate 10. The interconnect 220 is formed on the insulating interlayer 200. The interconnect 220 is connected to the second conductivity-type diffusion layer 116 through a contact 211 buried in the insulating interlayer 200. In detail, an electrode is formed in the surface of the second conductivity-type diffusion layer 116, and the electrode and the contact 211 are electrically connected to each other. In addition, the interconnect 220 is also connected to the first conductivity-type collector layer 108 through a contact 212 buried in the insulating interlayer 200. In detail, an electrode is formed in the surface of the first conductivity-type collector layer 108, and the electrode and the contact 212 are electrically connected to each other. That is, the first conductivity-type collector layer 108 and the second conductivity-type diffusion layer 116 (that is, sinker layer 115) are connected to each other through the contact 212, the interconnect 220, and the contact 211.

In the embodiment, the semiconductor device includes a second conductivity-type buried layer 114. The second conductivity-type buried layer 114 is formed under the sinker layer 115 and the first conductivity-type well 102, respectively, and is connected to the sinker layer 115 and the first conductivity-type well 102, respectively. The impurity concentration of the second conductivity-type buried layer 114 is higher than that of the first conductivity-type well 102. That is, the lateral side and the bottom of the first conductivity-type well 102 are surrounded by the sinker layer 115 and the second conductivity-type buried layer 114.

The substrate 10 is configured such that the first conductivity-type epitaxial layer 14 is epitaxially grown on a first conductivity-type semiconductor substrate 12 such as a silicon substrate. The second conductivity-type buried layer 114 is formed across the epitaxial layer 14 from the semiconductor substrate 12 when seen in the thickness direction of the substrate 10.

The first conductivity-type well extracting diffusion layer 107 is adjacent to the second conductivity-type emitter layer 106. The first conductivity-type well extracting diffusion layer 107 and the second conductivity-type emitter layer 106 are connected to each other through a silicide layer 109 formed in these surface layers. The silicide layer 109 is connected to an interconnect 222, formed in the surface layer of the insulating interlayer 200, through a contact 213 buried in the insulating interlayer 200.

In addition, a contact 214 is buried in the insulating interlayer 200. The contact 214 connects an interconnect 224 formed in the surface layer of the insulating interlayer 200 to the gate electrode 112. A sidewall is formed at a sidewall of the gate electrode 112.

Meanwhile, two sets of the second conductivity-type drift layer 104 and the first conductivity-type collector layer 108 are formed in the first conductivity-type well 102. That is, two IGBTs having the same structure are formed in the first conductivity-type well 102. These two IGBTs are line-symmetrically disposed with reference to a set of the first conductivity-type well extracting diffusion layer 107 and the second conductivity-type emitter layer 106, and share the first conductivity-type well extracting diffusion layer 107, the second conductivity-type emitter layer 106, and the first conductivity-type well 102. In addition, the gate insulating film 110 and the gate electrode 112 having the same structure are line-symmetrically disposed.

Figure 2:
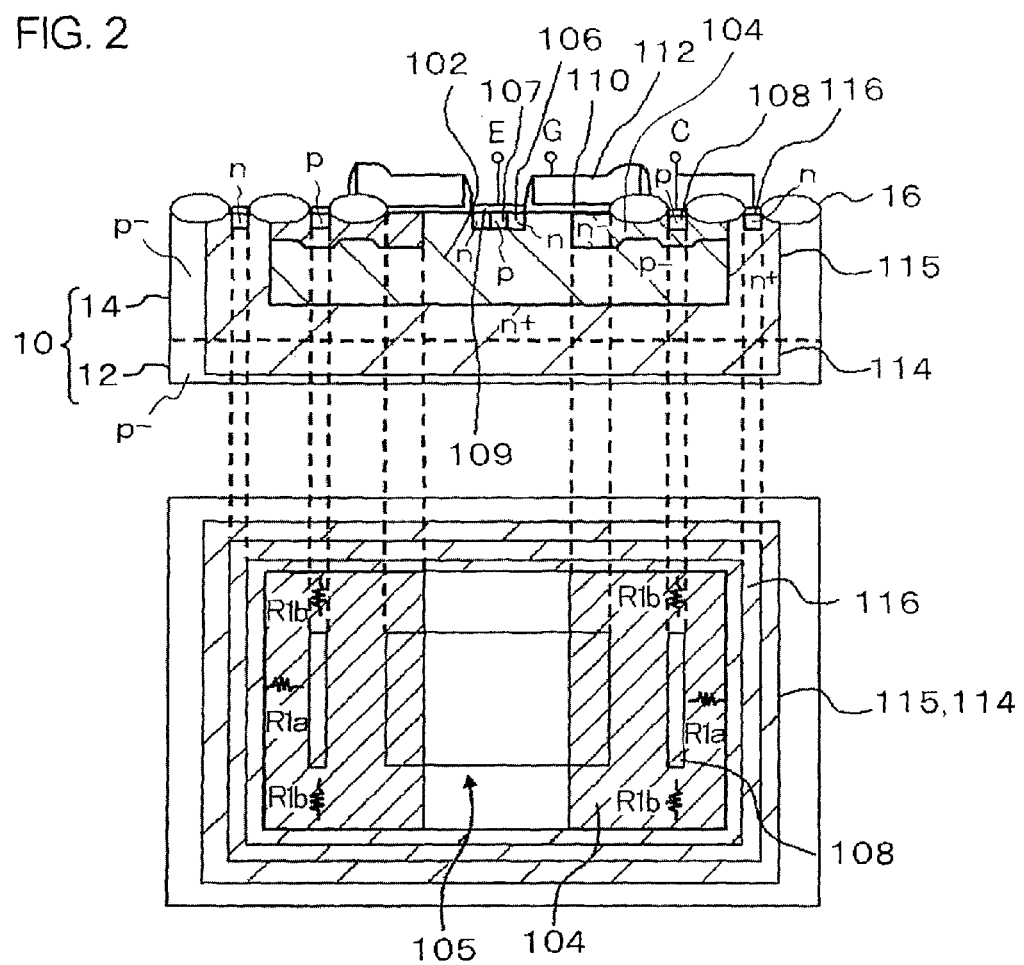
FIG. 2 is a diagram in which an insulating interlayer 200, each contact, and each interconnect are omitted from FIG. 1D, and is a plan view illustrating a layout of element isolation insulating films and each diffusion layer of the semiconductor device.

FIG. 2 is a plan view illustrating a layout of the element isolation insulating films 16 and each diffusion layer of the semiconductor device shown in FIG. 1D, and is a diagram in which the insulating interlayer 200, each contact, and each interconnect are omitted from FIG. 1D. As shown in these drawings, the second conductivity-type diffusion layer 116 is formed so as to surround the first conductivity-type well 102. The second conductivity-type emitter layer 106 and the first conductivity-type well extracting diffusion layer 107 are formed in the center of the region surrounded by the second conductivity-type diffusion layer 116 and the sinker layer 115. Meanwhile, a region 105 is indicative of a region in which the element isolation insulating film 16 is not formed. The element isolation insulating film 16 is also not formed in the first conductivity-type collector layer 108 and the second conductivity-type diffusion layer 116. The first conductivity-type collector layers 108 are formed at the positions separated from the region 105 in both sides of the region 105 when seen in a plan view.

Next, reference will be made to FIGS. 1A to 1D to describe the method of manufacturing the semiconductor device shown in FIG. 1D and FIG. 2. First, as shown in FIG. 1A, the semiconductor substrate 12 is prepared. Next, a second conductivity-type (n-type) impurity, for example, As or P is implanted into the semiconductor substrate 12. Thereby, the second conductivity-type buried layer 114 is formed in the semiconductor substrate 12.

Next, the first conductivity-type (p-type) epitaxial layer 14 is grown on the semiconductor substrate 12. At this time, since the semiconductor substrate 12 and the epitaxial layer 14 are heated, the second conductivity-type buried layer 114 formed in the semiconductor substrate 12 is diffused into the epitaxial layer 14. Thereby, the second conductivity-type buried layer 114 is formed across the epitaxial layer 14 from the semiconductor substrate 12 when seen in the thickness direction of the substrate 10.

Next, as shown in FIG. 1B, the element isolation insulating film 16 is formed in the epitaxial layer 14 using a LOCOS oxidation method. Meanwhile, the element isolation insulating film 16 may be formed by a separate method, for example, an STI method. Next, a first conductivity-type impurity, for example, B is selectively implanted into a region serving as the first conductivity-type well 102 in the epitaxial layer 14, and a second conductivity-type impurity, for example, As or P is selectively implanted into a region serving as the sinker layer 115 in the epitaxial layer 14. Thereafter, the impurities implanted into the epitaxial layer 14 are diffused into the inside of the epitaxial layer 14 by performing high-temperature heat treatment, and the first conductivity-type well 102 and the sinker layer 115 are formed.

Next, as shown in FIG. 1C, the second conductivity-type impurity, for example, As or P is selectively implanted into the epitaxial layer 14. Thereby, the second conductivity-type drift layer 104 is formed. Meanwhile, the portion located under the element isolation insulating film 16 in the second conductivity-type drift layer 104 is formed more shallowly than other regions because implanted ions penetrate the element isolation insulating film 16.

Next, as shown in FIG. 1D, the gate insulating film 110 and the gate electrode 112 are formed in a gate forming region of the epitaxial layer 14. The gate forming region includes a portion of the second conductivity-type drift layer 104, and a portion of the surface layer of the portion other than the second conductivity-type drift layer 104 in the first conductivity-type well 102. A portion of the gate electrode 112 is located on the element isolation insulating film 16. Next, the first conductivity-type impurity, for example, B is selectively implanted into a region serving as the first conductivity-type well extracting diffusion layer 107 and a region serving as the first conductivity-type collector layer 108. In addition, the second conductivity-type impurity, for example, As or P is selectively implanted into a region serving as the second conductivity-type emitter layer 106 and a region serving as the second conductivity-type diffusion layer 116. Thereby, the second conductivity-type emitter layer 106, the first conductivity-type well extracting diffusion layer 107, the first conductivity-type collector layer 108, and the second conductivity-type diffusion layer 116 are formed. Meanwhile, the second conductivity-type emitter layer 106 is formed in the surface layer of the first conductivity-type well 102, which is opposite to the second conductivity-type drift layer 104, through the gate electrode 112 when seen in a plan view.

Next, a metal layer is formed on the epitaxial layer 14, on the element isolation insulating film 16, and on the gate electrode 112, and this metal layer and the epitaxial layer 14 are heat-treated. Thereby, the silicide layer 109 is formed in the surface layer of the second conductivity-type emitter layer 106 and the surface layer of the first conductivity-type well extracting diffusion layer 107. In this process, the silicide layer is also formed in the surface layer of the gate electrode 112, the surface layer of the first conductivity-type collector layer 108, and the surface layer of the second conductivity-type diffusion layer 116. Here, the first conductivity-type well extracting diffusion layer 107 and the first conductivity-type collector layer 108 may be formed by a separate process. In addition, the second conductivity-type emitter layer 106 and the second conductivity-type diffusion layer 116 may be formed by a separate process.

Next, the insulating interlayer 200 is formed on the epitaxial layer 14, on the element isolation insulating film 16, and on the gate electrode 112. Next, connection holes serving as the contacts 211, 212, 213, and 214 are formed by selectively removing the insulating interlayer 200. Next, the contacts 211, 212, 213, and 214 are formed by burying a metal, for example, tungsten (W) in these connection holes. Next, the interconnects 220, 222, and 224 are formed in the surface layer of the insulating interlayer 200.

Figure 3:
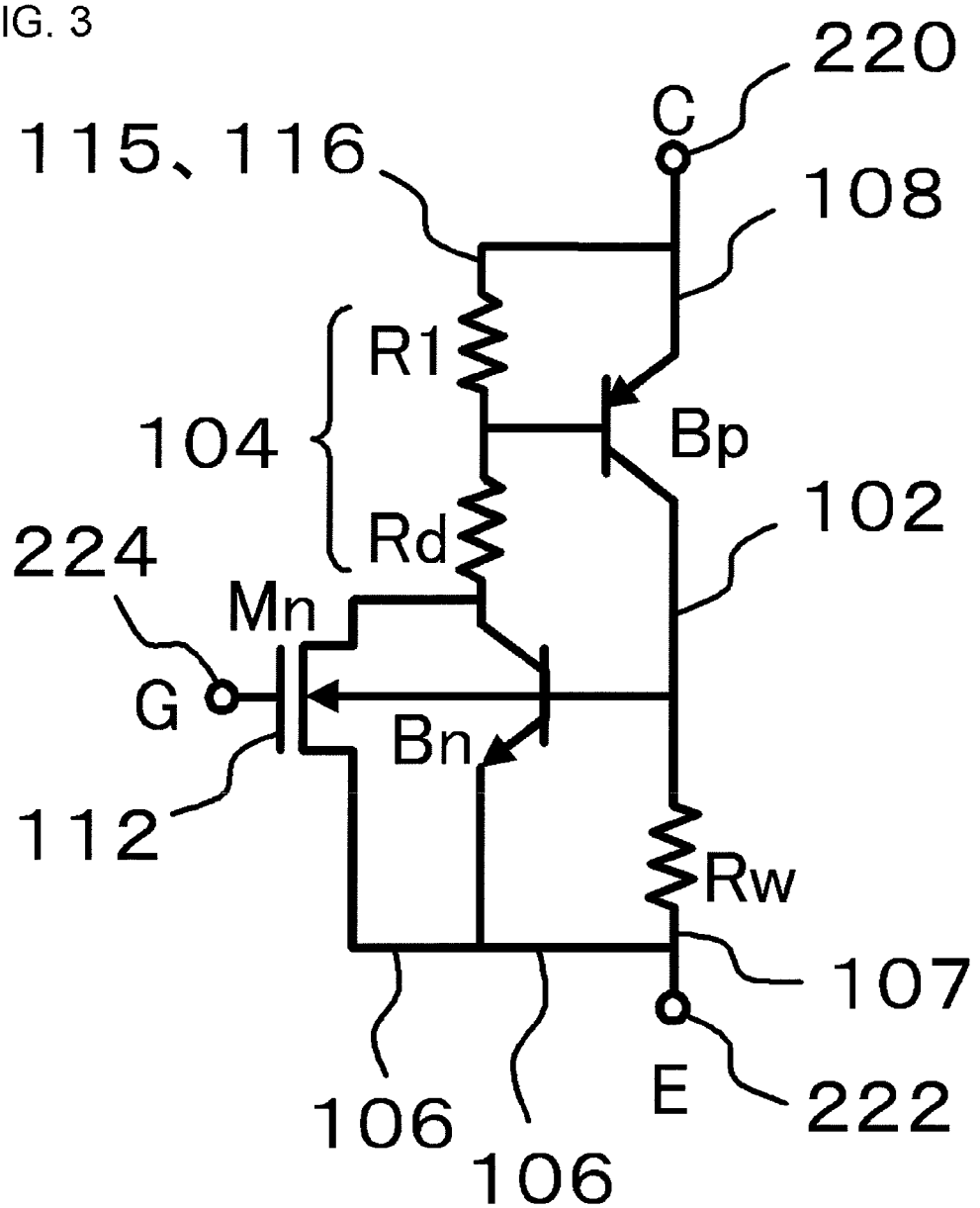
FIG. 3 is an equivalent circuit diagram of an IGBT having the semiconductor device shown in FIG. 1D and FIG. 2.

FIG. 3 is an equivalent circuit diagram of the IGBT having the semiconductor device shown in FIG. 1D and FIG. 2. In this IGBT, the gate of a MOS transistor Mn is the gate electrode 112, the drain thereof is the sinker layer 115 and the second conductivity-type diffusion layer 116, and the source thereof is the second conductivity-type emitter layer 106. In addition, the emitter of a PNP bipolar transistor Bp is the first conductivity-type collector layer 108, the collector thereof is the first conductivity-type well extracting diffusion layer 107, and the base thereof is the second conductivity-type drift layer 104. A resistor $R_1$ related to the second conductivity-type drift layer 104 exists between the sinker layer 115 and the first conductivity-type collector layer 108, and a resistor $R_d$ related to the second conductivity-type drift layer 104 also exists between the first conductivity-type collector layer 108 and a channel region of the MOS transistor Mn.

Next, operations and effects of the embodiment will be described. According to the embodiment, the first conductivity-type collector layer 108 and the sinker layer 115 are short-circuited through the contacts 211 and 212 and the interconnect 220. For this reason, a large amount of minority carriers generated at the time of turnoff of the bipolar transistor Bp included in the IGBT can be extracted to the interconnect 220 through the sinker layer 115. Therefore, the turnoff time can be shortened.

Additionally, in order to operate the bipolar transistor Bp included in the IGBT, the product of the resistance $R_1$ between the first conductivity-type collector layer 108 and the second conductivity-type diffusion layer 116 and the electronic current I flowing between the first conductivity-type collector layer 108 and the second conductivity-type diffusion layer 116 is required to be set to be equal to or more than the built-in potential of a pn diode including the first conductivity-type collector layer 108, the second conductivity-type drift layer 104, and the second conductivity-type diffusion layer 116. On the other hand, in the embodiment, since the first conductivity-type collector layer 108 and the sinker layer 115 are separated from each other, it is possible to increase the resistance $R_1$ between the second conductivity-type diffusion layer 116 and the first conductivity-type collector layer 108. Therefore, the bipolar transistor Bp included in the IGBT is easily operated. For this reason, it is possible to suppress a decrease in the saturation current of the IGBT.

Figure 11:
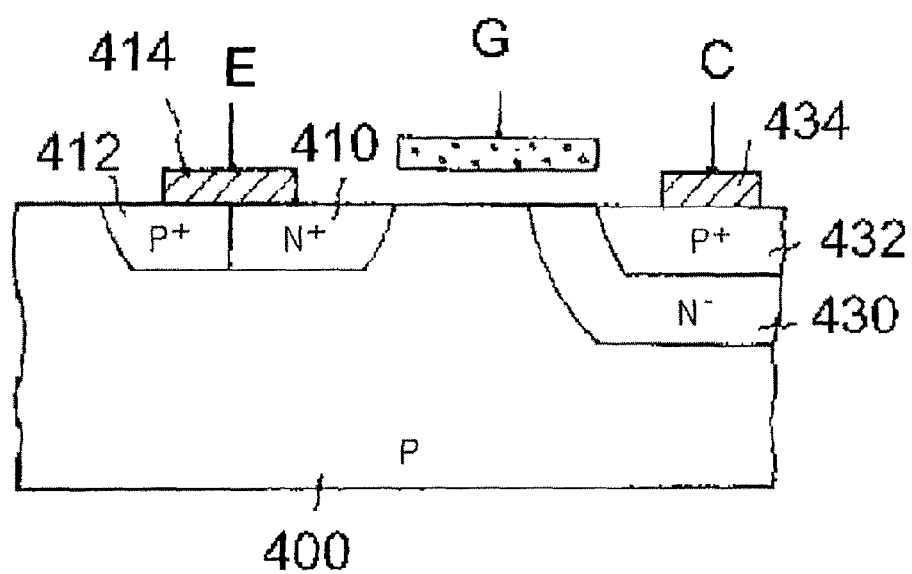
FIG. 11 is a diagram illustrating the configuration of a first semiconductor device disclosed in Japanese Unexamined Patent Publication No. H05-283622.

Additionally, in the step of forming the second conductivity-type emitter layer 106, the second conductivity-type diffusion layer 116 is formed in the surface layer of the sinker layer 115. For this reason, it is possible to prevent the number of processes for manufacturing the semiconductor device shown in FIG. 1D and FIG. 2 from increasing from the number of processes for manufacturing the semiconductor device shown in FIG. 11 or FIG. 12. Therefore, it is possible to suppress an increase in the manufacturing cost.

Figure 4:
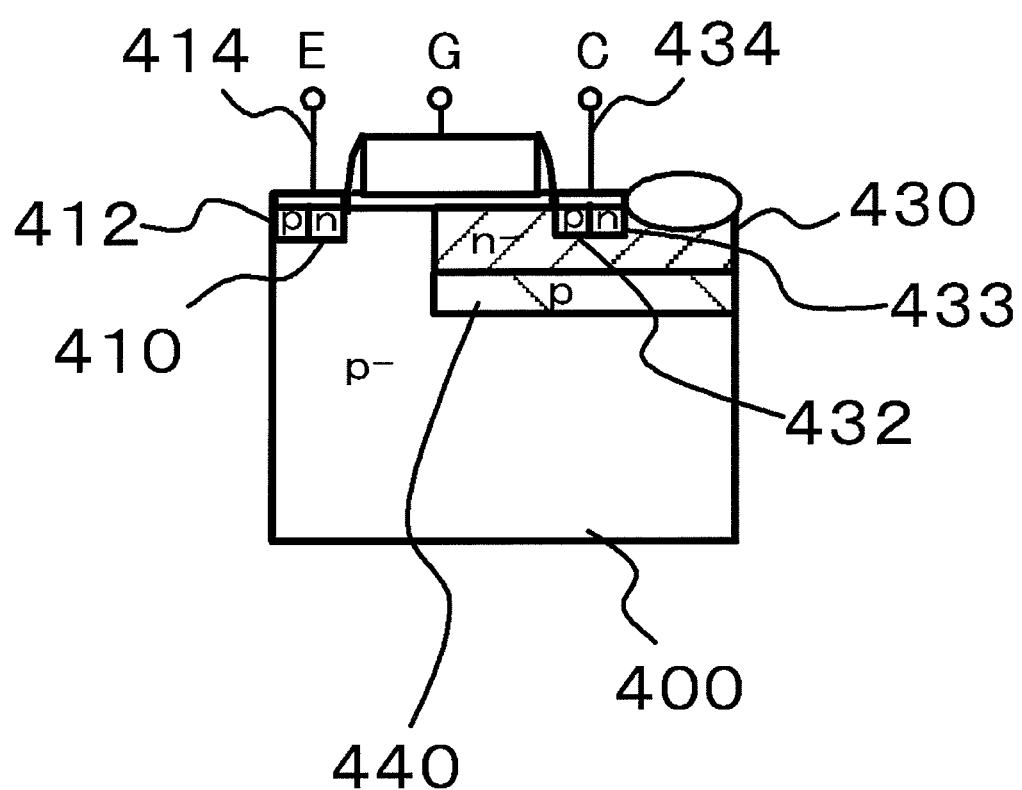
FIG. 4 is a cross-sectional view illustrating the configuration of the semiconductor device according to a comparative example.
Figure 12:
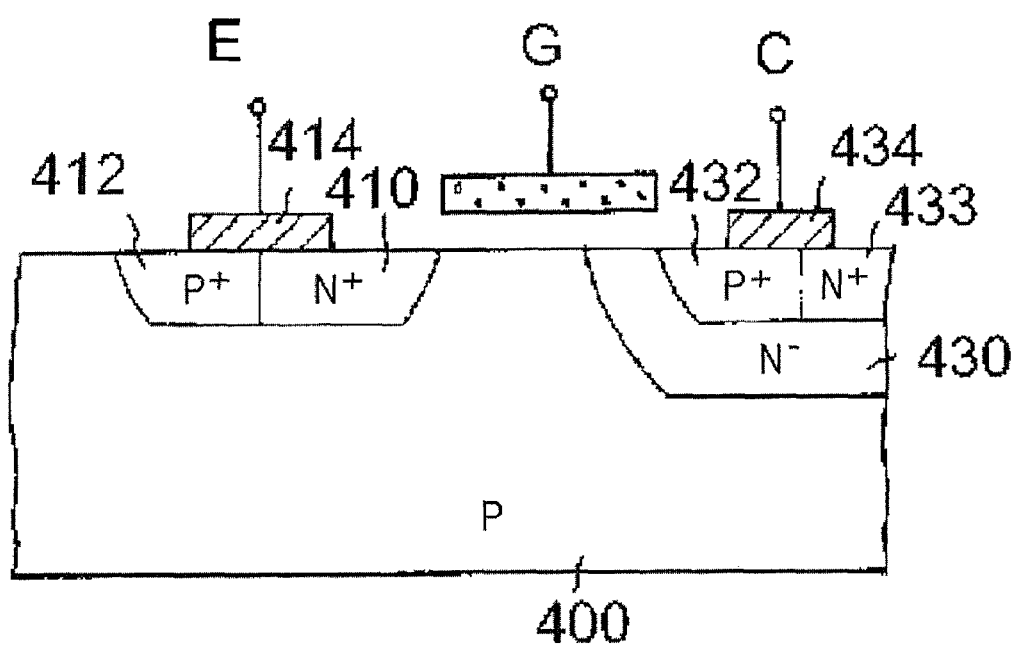
FIG. 12 is a diagram illustrating the configuration of a second semiconductor device disclosed in Japanese Unexamined Patent Publication No. H05-283622.

Meanwhile, as shown in FIG. 4, it is also considered that a reduced surface field (RESURF) structure often used for the structure shown in FIG. 12 in order to simultaneously realize a high voltage and a low on-resistance is applied to an n⁻ drift layer 430. However, in this case, an advantage can be obtained that the concentration can be raised by as much as the depletion of the n⁻ drift layer 430 is promoted by a p-layer 440 provided just below the n⁻ drift layer, which results in a reduction in the on-resistance. On the other hand, since the resistance $R_1$ is reduced, it becomes increasingly difficult for the bipolar transistor to be turned on.

Figure 6A:
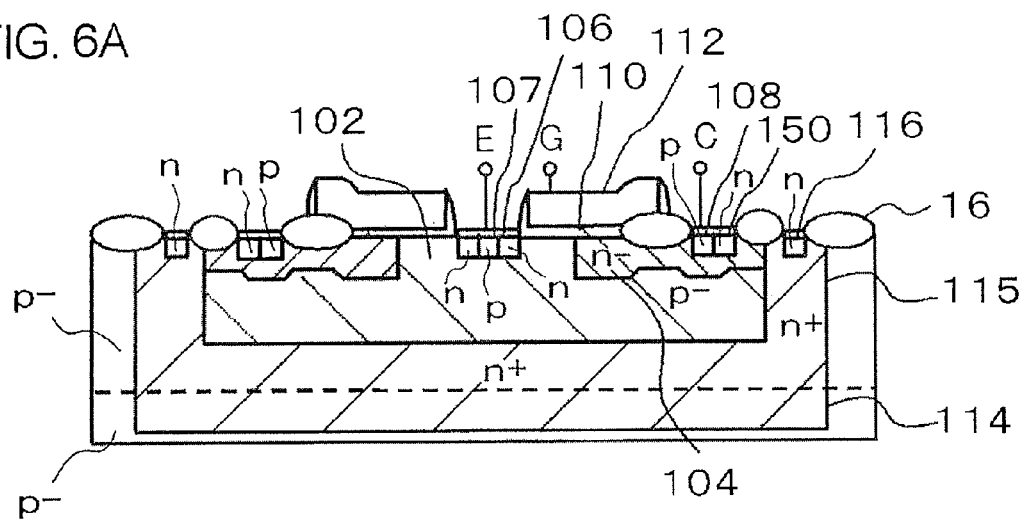
FIGS. 6A and 6B are cross-sectional views illustrating the configuration of the semiconductor device according to the comparative example.
Figure 6B:
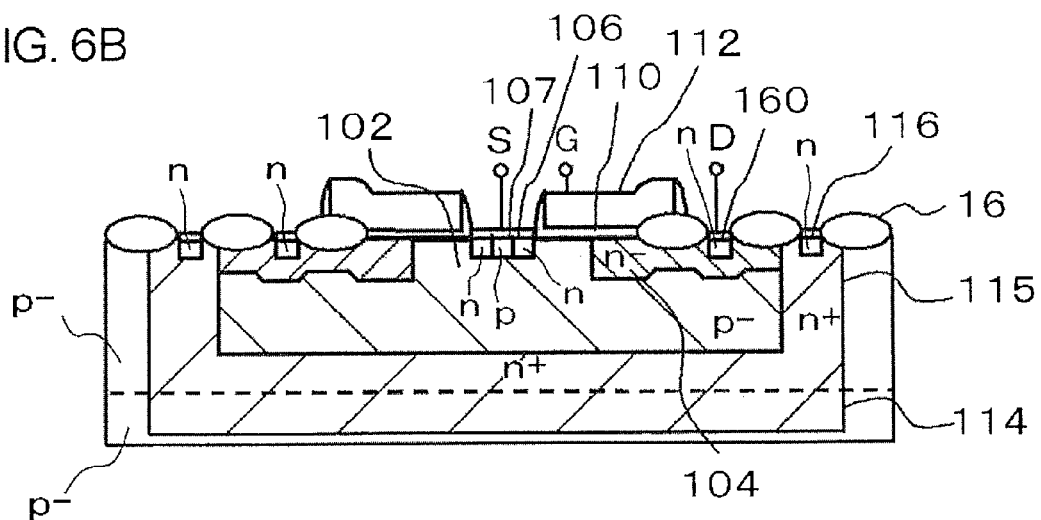

FIG. 5 is a graph illustrating a first effect of the embodiment. This graph shows the characteristics of $I_c$ (collector current)-$V_{ce}$ (voltage between the collector and the emitter) of the semiconductor device shown in FIG. 1D and FIG. 2 and the semiconductor device according to the comparative example shown in FIGS. 6A and 6B, respectively (or characteristics of $I_d$ (drain current)-$V_{ds}$ (voltage between the drain and the source)). The semiconductor device shown in FIG. 6A is configured such that a second conductivity-type diffusion layer 150 is added to the semiconductor device shown in FIG. 1D and FIG. 2, and has the same configuration as the semiconductor device shown in FIG. 12. The semiconductor device shown in FIG. 6B is configured such that a second conductivity-type collector layer 160 is provided in place of the first conductivity-type collector layer 108 in the semiconductor device shown in FIG. 1D and FIG. 2, and has the same configuration as the semiconductor device shown in FIG. 11. Meanwhile, in the semiconductor device shown in FIGS. 6A and 6B, the second conductivity-type diffusion layer 116 is not connected to the interconnect 220.

Meanwhile, in all the semiconductor devices shown in the graph of FIG. 5, the size and the impurity concentration of the second conductivity-type drift layer 104 are designed so that the off resistant voltage is set to 100 V.

As shown in FIG. 5, the amount of saturation current of $I_c$ of the semiconductor device shown in FIG. 1D and FIG. 2 considerably rises by approximately 1.5 times that of the semiconductor device shown in FIGS. 6A and 6B. The configuration of the semiconductor device shown in FIGS. 6A and 6B is the same as that of the semiconductor device shown in FIG. 1D and FIG. 2 except for the points mentioned above. Consequently, the reason for the considerable rise in the amount of saturation current of $I_c$ by approximately 1.5 times is that the bipolar transistor of the IGBT is operated by separating the first conductivity-type collector layer 108 and the sinker layer 115 from each other. Meanwhile, the reason for the decrease in the amount of saturation current of $I_c$ in the semiconductor device shown in FIG. 6A is that the bipolar transistor is not operated, and the size of the second conductivity-type drift layer 104 is made larger by the size of the first conductivity-type collector layer 108 provided.

Figure 7:
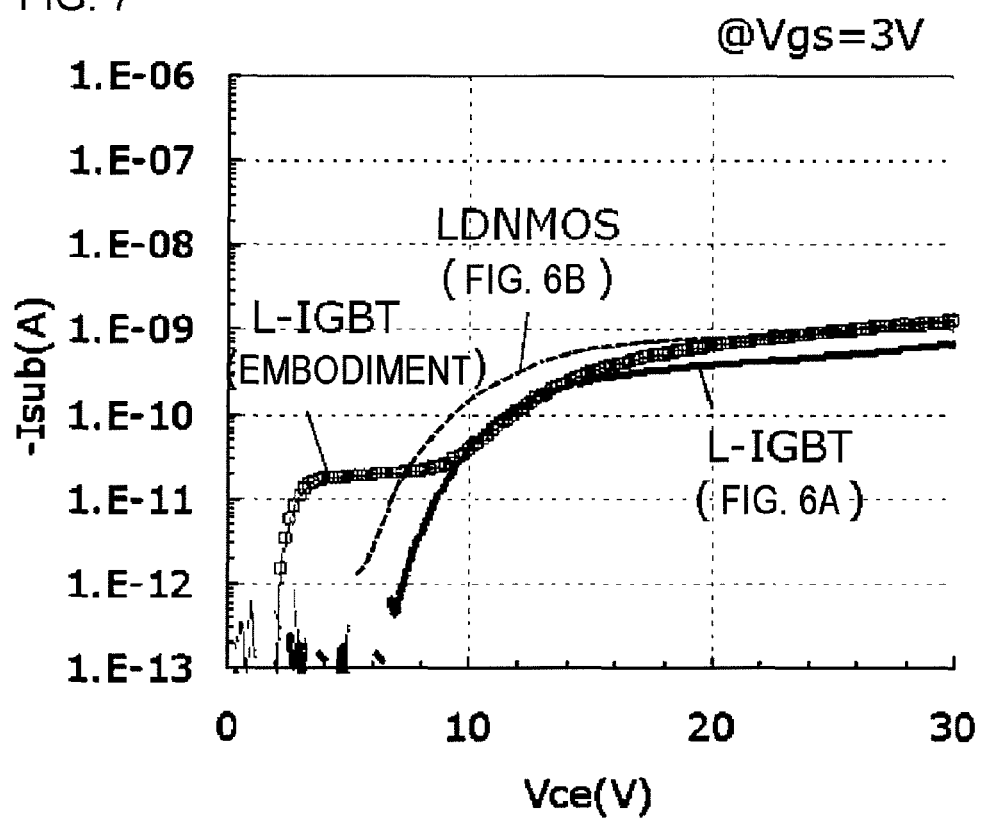
FIG. 7 is a graph illustrating a second effect of the embodiment.
Figure 8:
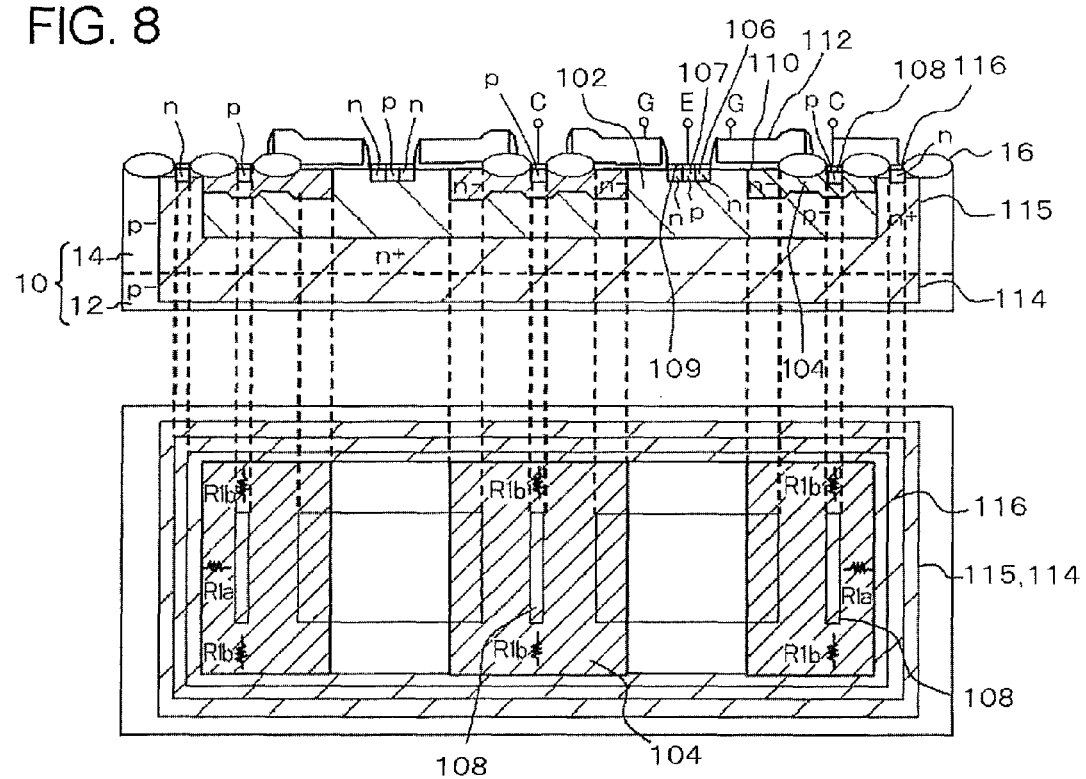
FIG. 8 is a cross-sectional view illustrating the configuration of the semiconductor device according to a second embodiment, and is a plan view of the semiconductor device.

FIG. 7 is a graph illustrating a second effect of the embodiment. This graph shows the characteristics of $I_{sub}$ (substrate leakage current)-$V_{ce}$ (voltage between the collector and the emitter) of the semiconductor device shown in FIG. 10 and FIG. 2 and the semiconductor device according to the comparative example shown in FIGS. 6A and 6B, respectively. As shown in FIG. 8, the amount of substrate leakage current according to the embodiment is suppressed in order to be as small as the amount of substrate leakage current according to the comparative example. This is because the substrate 10 and a back gate region of the MOS transistor are isolated from each other by surrounding the first conductivity-type well 102 by the sinker layer 115 and the second conductivity-type buried layer 114.

FIG. 8 is a cross-sectional view illustrating the configuration of the semiconductor device according to a second embodiment, and is a plan view of the semiconductor device.

Each of these drawings corresponds to FIG. 2 in the first embodiment. The semiconductor device shown in these drawings is configured such that two IGBTs shown in FIG. 1D are provided in one first conductivity-type well 102. These two IGBTs are disposed side by side in the first direction (horizontal direction in FIG. 8), and share the second conductivity-type drift layer 104 and the first conductivity-type collector layer 108 located at one side. This shared second conductivity-type drift layer 104 is configured such that the portion (portion extending from side to side in FIG. 8) parallel to the first direction in the circumferential portions is in contact with the sinker layer 115. In detail, the planar shape of each region is rectangular. One side of the shared second conductivity-type drift layer 104 and two sides opposite to this one side are in contact with the sinker layer 115.

Even when a plurality of IGBTs, as in the embodiment, exists in parallel in the one first conductivity-type well 102, that is, the region surrounded by one sinker layer 115, the inner collector diffusion layer 108 is connected to the sinker layer 115 through a resistor R1b of the second conductivity-type drift layer 104 in the gate width direction (vertical direction of FIG. 8), thereby allowing the same effect as that of the first embodiment to be obtained.

Figure 9:
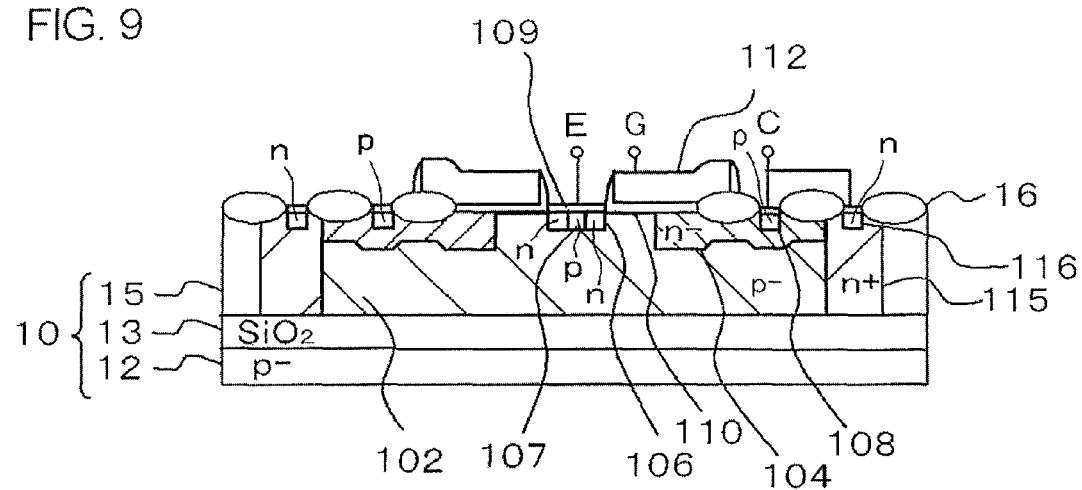
FIG. 9 is a cross-sectional view illustrating the configuration of the semiconductor device according to a third embodiment.

FIG. 9 is a cross-sectional view illustrating the configuration of the semiconductor device according to a third embodiment. This semiconductor device has the same configuration as that of the semiconductor device shown in the first embodiment or the second embodiment except for the following point.

First, a silicon-on-insulator (SOI) substrate is used as the substrate 10. That is, the substrate 10 is configured such that an insulating layer 13 such as a silicon oxide layer and a semiconductor layer 15 are laminated on the semiconductor substrate 12 in this order. The first conductivity-type well 102 and the sinker layer 115 are formed within the semiconductor layer 15 in the depth direction, and the lower ends thereof reach the insulating layer 13. The second conductivity-type buried layer 114 is not formed in the semiconductor device shown in FIG. 9.

According to the embodiment, by the same operation as that of the first embodiment, the turnoff time of the bipolar transistor included in the IGBT can also be shortened, and the bipolar transistor included in the IGBT is easily operated. In addition, the first conductivity-type well 102 is surrounded by the sinker layer 115 and the insulating layer 13. That is, the lower surface of the first conductivity-type well 102 is covered by the insulating layer 13 in place of the second conductivity-type buried layer 114, thereby allowing the substrate leakage current to be further suppressed.

Figure 10:
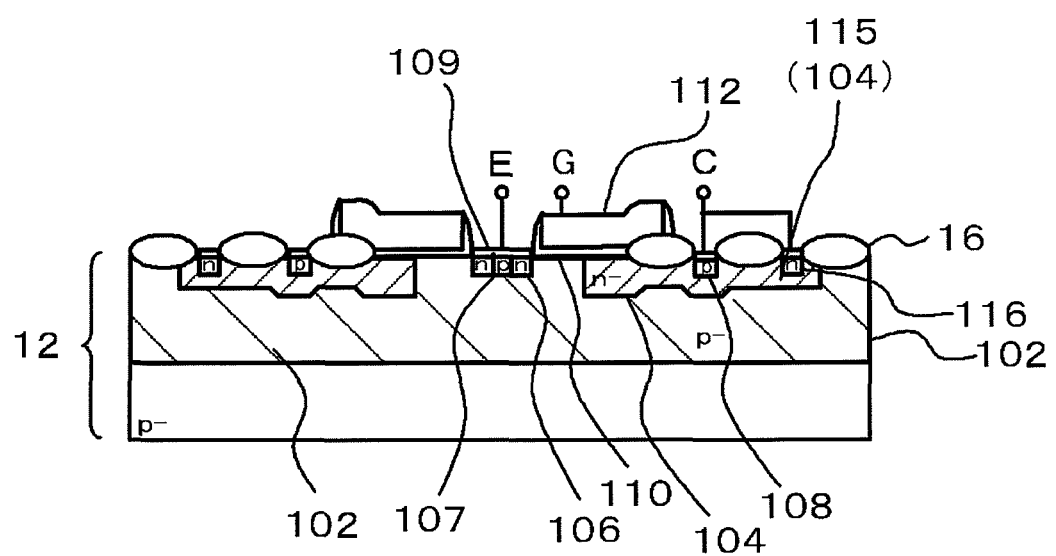
FIG. 10 is a cross-sectional view illustrating the configuration of the semiconductor device according to a fourth embodiment.

FIG. 10 is a cross-sectional view illustrating the configuration of the semiconductor device according to a fourth embodiment. This semiconductor device has the same configuration as that of the semiconductor device according to the first embodiment except for the following point.

First, the semiconductor substrate 12 itself is used as a substrate. In addition, the sinker layer 115 is formed as a portion of the second conductivity-type drift layer 104. That is, in the embodiment, the second conductivity-type diffusion layer 116 is formed in the surface layer of the second conductivity-type drift layer 104 and in the position separated from the first conductivity-type collector layer 108. The second conductivity-type diffusion layer 116 and the first conductivity-type collector layer 108 are isolated from each other by the element isolation insulating film 16 formed in the surface layer of the second conductivity-type drift layer 104.

In addition, the second conductivity-type diffusion layer 116 is not formed in the semiconductor substrate 12.

According to the embodiment, by the same operation as that of the first embodiment, the turnoff time of the bipolar transistor included in the IGBT can also be shortened, and the bipolar transistor included in the IGBT is easily operated. In addition, the semiconductor substrate 12 itself can be used, thereby allowing the manufacturing cost of the semiconductor device to be reduced.

As described above, although the embodiments of the invention have been set forth with reference to the drawings, they are merely illustrative of the invention, and various configurations other than those stated above can be adopted.

It is apparent that the present invention is not limited to the above embodiment, and may be modified and changed without departing from the scope and spirit of the invention.

What is claimed is:

1. A semiconductor device comprising:
    a substrate having a first conductivity-type semiconductor layer in the surface layer;
    a first first-conductivity-type high-concentration diffusion layer, formed in the surface layer of said first conductivity-type semiconductor layer, which has a higher impurity concentration than that of said first conductivity-type semiconductor layer;
    a first second-conductivity-type high-concentration diffusion layer, formed in the surface layer of said first conductivity-type semiconductor layer, which is in contact with said first first-conductivity-type high-concentration diffusion layer;
    a second conductivity-type low-concentration drift layer, formed in the surface layer of said first conductivity-type semiconductor layer, which has a lower impurity concentration than that of said first second-conductivity-type high-concentration diffusion layer;
    a gate insulating film formed so as to cover the surface of said first conductivity-type semiconductor layer between said first second-conductivity-type high-concentration diffusion layer and said second conductivity-type low-concentration drift layer, and a portion of said second conductivity-type low-concentration drift layer;
    a gate electrode formed over said gate insulating film;
    a second first-conductivity-type high-concentration diffusion layer formed in the surface layer of said second conductivity-type low-concentration drift layer;
    a second conductivity-type sinker layer, of which at least a portion is formed in the surface layer of said first conductivity-type semiconductor layer, of which a portion is in contact with said second conductivity-type low-concentration drift layer, and which is separated from said second first-conductivity-type high-concentration diffusion layer;
    a second second-conductivity-type high-concentration diffusion layer formed in the surface layer of said second conductivity-type sinker layer; and
    an interconnect, formed over said first conductivity-type semiconductor layer, which connects said second first-conductivity-type high-concentration diffusion layer and said second second-conductivity-type high-concentration diffusion layer to each other.

2. The semiconductor device according to claim 1, further comprising:
    an element isolation insulating film, formed in the surface layer of said first conductivity-type semiconductor layer, which is disposed so as to isolate said second first-conductivity-type high-concentration diffusion layer and said second second-conductivity-type high-concentration diffusion layer from each other.

3. The semiconductor device according to claim 1,
wherein said second conductivity-type sinker layer is provided so as to surround said second conductivity-type low-concentration drift layer, said first second-conductivity-type high-concentration diffusion layer, and said first first-conductivity-type high-concentration diffusion layer, when seen in a plan view, and
said first conductivity-type semiconductor layer has a higher impurity concentration at the portion located at the internal side of said second conductivity-type sinker layer than the impurity concentration at the portion located at the external side of said second conductivity-type sinker layer.

4. The semiconductor device according to claim 3, further comprising:
a second conductivity-type buried layer, formed under said second conductivity-type sinker layer and said first conductivity-type semiconductor layer, respectively, which is in contact with said second conductivity-type sinker layer and said first conductivity-type semiconductor layer, respectively.

5. The semiconductor device according to claim 4,
wherein said substrate includes:
a semiconductor substrate; and
an epitaxial layer epitaxially grown over said semiconductor substrate, and
said second conductivity-type buried layer is formed across said epitaxial layer from said semiconductor substrate.

6. The semiconductor device according to claim 1,
wherein said substrate is a silicon-on-insulator (SOI) substrate in which an insulating layer and a semiconductor layer are laminated over a semiconductor substrate in this order, and
said second conductivity-type sinker layer is formed within said semiconductor layer in the depth direction, and the lower end thereof reaches said insulating layer.

7. A semiconductor device comprising:
a substrate having a first conductivity-type semiconductor layer in the surface layer;
a first first-conductivity-type high-concentration diffusion layer, formed in the surface layer of said first conductivity-type semiconductor layer, which has a higher impurity concentration than that of said first conductivity-type semiconductor layer;
a first second-conductivity-type high-concentration diffusion layer, formed in the surface layer of said first conductivity-type semiconductor layer, which is in contact with said first first-conductivity-type high-concentration diffusion layer;
a second conductivity-type low-concentration drift layer, formed in the surface layer of said first conductivity-type semiconductor layer, which has a lower impurity concentration than that of said first second-conductivity-type high-concentration diffusion layer;
a gate oxide film formed so as to cover the surface of said first conductivity-type semiconductor layer between said first second-conductivity-type high-concentration diffusion layer and said second conductivity-type low-concentration drift layer, and a portion of said second conductivity-type low-concentration drift layer;
a gate electrode formed over said gate oxide film;
a second first-conductivity-type high-concentration diffusion layer formed in the surface layer of said second conductivity-type low-concentration drift layer;
a second second-conductivity-type high-concentration diffusion layer, separated from said second first-conductivity-type high-concentration diffusion layer, which is formed in the surface layer of said second conductivity-type low-concentration drift layer, and
an interconnect, formed over said first conductivity-type semiconductor layer, which connects said second first-conductivity-type high-concentration diffusion layer and said second second-conductivity-type high-concentration diffusion layer to each other.

8. A method of manufacturing a semiconductor device, comprising:
forming a second conductivity-type low-concentration drift layer, located at a portion of the surface layer of a first conductivity-type semiconductor layer, in a substrate having said first conductivity-type semiconductor layer in the surface layer;
forming a gate insulating film and a gate electrode located over said gate insulating film in a gate forming region including a portion of said second conductivity-type low-concentration drift layer, and a portion of the surface layer of the portion other than said second conductivity-type low-concentration drift layer in said first conductivity-type semiconductor layer;
forming a first second-conductivity-type high-concentration diffusion layer, having a higher impurity concentration than that of said second conductivity-type low-concentration drift layer, in the surface layer of said first conductivity-type semiconductor layer opposite to said second conductivity-type low-concentration drift layer through said gate electrode when seen in a plan view;
forming a first first-conductivity-type high-concentration diffusion layer, having a higher impurity concentration than that of said first conductivity-type semiconductor layer, in the surface layer of said first conductivity-type semiconductor layer so as to be in contact with said first second-conductivity-type high-concentration diffusion layer;
forming a second first-conductivity-type high-concentration diffusion layer in the surface layer of said second conductivity-type low-concentration drift layer;
forming a second conductivity-type sinker layer, of which a portion is in contact with said second conductivity-type low-concentration drift layer within said first conductivity-type semiconductor layer, in a position separated from said second first-conductivity-type high-concentration diffusion layer;
forming a second second-conductivity-type high-concentration diffusion layer in the surface layer of said second conductivity-type sinker layer; and
forming an interconnect, which connects said second second-conductivity-type high-concentration diffusion layer and said second first-conductivity-type high-concentration diffusion layer to each other, over said first conductivity-type semiconductor layer.

9. The method of manufacturing a semiconductor device according to claim 8, further comprising:
forming an element isolation insulating film in the surface layer of said first conductivity-type semiconductor layer so as to isolate said second second-conductivity-type high-concentration diffusion layer and said second first-conductivity-type high-concentration diffusion layer.

10. The method of manufacturing a semiconductor device according to claim 8,
wherein said step of forming said first second-conductivity-type high-concentration diffusion layer and said step of forming said second second-conductivity-type high-concentration diffusion layer are performed by the same process, and said step of forming said first first-conductivity-type high-concentration diffusion layer and said step of forming said second first-conductivity-type high-concentration diffusion layer are performed by the same process.

11. A method of manufacturing a semiconductor device, comprising:

forming a second conductivity-type low-concentration drift layer, located at a portion of the surface layer of a first conductivity-type semiconductor layer, in a substrate having said first conductivity-type semiconductor layer in the surface layer;

forming a gate insulating film and a gate electrode located over said gate insulating film in a gate forming region including a portion of said second conductivity-type low-concentration drift layer, and a portion of the surface layer of the portion other than said second conductivity-type low-concentration drift layer in said first conductivity-type semiconductor layer;

forming a first second-conductivity-type high-concentration diffusion layer, having a higher impurity concentration than that of said second conductivity-type low-concentration drift layer, in the surface layer of said first conductivity-type semiconductor layer opposite to said second conductivity-type low-concentration drift layer through said gate electrode when seen in a plan view;

forming a first first-conductivity-type high-concentration diffusion layer, having a higher impurity concentration than that of said first conductivity-type semiconductor layer, in the surface layer of said first conductivity-type semiconductor layer so as to be in contact with said first second-conductivity-type high-concentration diffusion layer;

forming a second first-conductivity-type high-concentration diffusion layer in the surface layer of said second conductivity-type low-concentration drift layer;

forming a second second-conductivity-type high-concentration diffusion layer in a position separated from said second first-conductivity-type high-concentration diffusion layer, in the surface layer of said second conductivity-type low-concentration drift layer; and forming an interconnect, which connects said second second-conductivity-type high-concentration diffusion layer and said second first-conductivity-type high-concentration diffusion layer, over said first conductivity-type semiconductor layer, to each other.

* * * * *